(12) United States Patent
Kim et al.

(10) Patent No.: US 12,272,803 B2
(45) Date of Patent: Apr. 8, 2025

(54) ELECTRODE ASSEMBLY FOR EVALUATING PERFORMANCE OF ELECTRODE AND METHOD FOR EVALUATING PERFORMING ELECTRODE

(71) Applicant: LG ENERGY SOLUTION, LTD., Seoul (KR)

(72) Inventors: Hye Bin Kim, Daejeon (KR); Yong Jun Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 727 days.

(21) Appl. No.: 17/605,258

(22) PCT Filed: Nov. 17, 2020

(86) PCT No.: PCT/KR2020/016175
§ 371 (c)(1),
(2) Date: Oct. 21, 2021

(87) PCT Pub. No.: WO2021/137426
PCT Pub. Date: Jul. 8, 2021

(65) Prior Publication Data
US 2022/0255151 A1    Aug. 11, 2022

(30) Foreign Application Priority Data
Jan. 2, 2020    (KR) .................. 10-2020-0000439

(51) Int. Cl.
*H01M 10/48*     (2006.01)
*H01M 4/38*      (2006.01)
*H01M 10/0525*   (2010.01)

(52) U.S. Cl.
CPC ........... *H01M 10/48* (2013.01); *H01M 4/382* (2013.01); *H01M 10/0525* (2013.01)

(58) Field of Classification Search
CPC .. H01M 10/48; H01M 4/382; H01M 10/0525; H01M 10/4285; G01R 31/378
(Continued)

(56) References Cited

U.S. PATENT DOCUMENTS

| | | | |
|---|---|---|---|
| 2006/0057433 A1 | 3/2006 | Ando et al. | |
| 2013/0131745 A1* | 5/2013 | Viavattine | H01M 10/0525 607/9 |

(Continued)

FOREIGN PATENT DOCUMENTS

| | | |
|---|---|---|
| CN | 203910934 U | 10/2014 |
| CN | 105308786 A | 2/2016 |

(Continued)

OTHER PUBLICATIONS

International Search Report for PCT/KR2020/016175 mailed on Feb. 25, 2021.
(Continued)

*Primary Examiner* — Ekandra S. Miller-Cruz
*Assistant Examiner* — Kevin Nguyen
(74) *Attorney, Agent, or Firm* — Birch, Stewart, Kolasch & Birch, LLP (57) ABSTRACT

A method and electrode assembly for evaluating performance of an electrode uses a negative electrode on which a negative electrode active material is applied to both surfaces of a negative electrode collector; a positive electrode on which a positive electrode active material is applied to both surfaces of a positive electrode collector and which is stacked with the negative electrode; two separators stacked between the negative electrode and the positive electrode; a reference electrode stacked between the two separators; and a second negative electrode stacked between the separator, which is relatively close to the negative electrode, of the two separators and the negative electrode.

12 Claims, 6 Drawing Sheets

(58) Field of Classification Search
USPC .......................................................... 429/90
See application file for complete search history.

(56) References Cited

U.S. PATENT DOCUMENTS

| | | | |
|---|---|---|---|
| 2014/0375325 | A1 | 12/2014 | Wang et al. |
| 2015/0160300 | A1 | 6/2015 | Ishii et al. |
| 2015/0263379 | A1 | 9/2015 | Xiao et al. |
| 2017/0234930 | A1 | 8/2017 | Lee et al. |
| 2018/0097255 | A1 | 4/2018 | Jung et al. |
| 2019/0094309 | A1 | 3/2019 | Cho et al. |
| 2019/0165429 | A1* | 5/2019 | Lu .......................... H01M 4/134 |
| 2020/0091567 | A1 | 3/2020 | Takahashi |

FOREIGN PATENT DOCUMENTS

| | | |
|---|---|---|
| CN | 207530063 U | 6/2018 |
| CN | 108427077 A | 8/2018 |
| CN | 109073709 A | 12/2018 |
| CN | 108630980 A | 12/2024 |
| JP | 2011-3318 A | 1/2011 |
| JP | 2013089363 A * | 5/2013 |
| JP | 2014-32826 A | 2/2014 |
| JP | 6151163 B2 | 6/2017 |
| JP | 2018-129136 A | 8/2018 |
| JP | 6507679 B2 | 5/2019 |
| KR | 10-2016-0128834 A | 11/2016 |
| KR | 10-2017-0043761 A | 4/2017 |
| KR | 10-2018-0050248 A | 5/2018 |
| KR | 10-1897859 B1 | 9/2018 |
| KR | 10-2019-0083130 A | 7/2019 |
| KR | 10-2014474 B1 | 8/2019 |
| KR | 10-2082483 B1 | 2/2020 |
| WO | WO 2015/049778 A1 | 4/2015 |
| WO | WO-2018084675 A1 * | 5/2018 ............. G01R 31/36 |

OTHER PUBLICATIONS

Extended European Search Report for European Application No. 20909425.9 dated Jul. 13, 2022.

* cited by examiner

ELECTRODE ASSEMBLY FOR EVALUATING PERFORMANCE OF ELECTRODE AND METHOD FOR EVALUATING PERFORMING ELECTRODE

CROSS-REFERENCE TO RELATED APPLICATION

The present application claims the benefit of the priority of Korean Patent Application No. 10-2020-0000439, filed on Jan. 2, 2020, which is hereby incorporated by reference in its entirety.

TECHNICAL FIELD

The present invention relates to an electrode assembly for evaluating performance of an electrode, and more particularly, to an electrode assembly for evaluating performance of an electrode, which is capable of calculating a more reliable safety voltage value by measuring a potential value based on a second negative electrode and a method for evaluating performance of an electrode using the electrode assembly for evaluating the performance of the electrode.

BACKGROUND ART

Unlike primary batteries, rechargeable secondary batteries are being developed not only for digital devices but also for vehicles such as electric vehicles.

Secondary batteries are variously classified according to materials and external shapes of a positive electrode and a negative electrode. Among them, since such a lithium secondary battery using a lithium compound material has large capacity and a low self-discharge rate, the lithium secondary battery is being widely used instead of a nickel-cadmium secondary battery according to the related art.

Also, the lithium secondary battery may be manufactured in various shapes. Representatively, the lithium secondary battery may be manufactured in a cylinder type, a prismatic type, or a pouch type.

As the use of such lithium secondary batteries increases, needs for shortening a charging time is increasing, and thus, research and development for shortening the charging time are continuously being conducted.

Here, it is important to accurately measure the range in which lithium dendrite does not occur by analyzing the negative potential of the mounted electrode assembly for the charging characteristics of the secondary battery. In order to shorten the charging time, when the charging is performed at the high voltage, the lithium dendrite may occur in the surface of the negative electrode, and when the lithium dendrite occurs, the electrolyte may be decomposed to generate the combustible gas, thereby causing the swelling of the secondary battery.

Therefore, in order to rapidly charge the secondary battery, when the constant current is applied to the electrode assembly, the potential at which the lithium dendrite occurs should be checked, and the charging should be performed at the safest voltage in the shortest time.

Therefore, it is necessary to accurately measure the potential difference (safety voltage) at which the lithium dendrite occurs.

DISCLOSURE OF THE INVENTION

Technical Problem

A main object of the present invention is to provide an electrode assembly for evaluating performance of an electrode, which is capable of not only separating and observing a negative electrode potential and a positive electrode potential through a reference electrode, but also measuring a safety voltage based on a surface potential (a potential on an outer surface of a negative electrode active material) of a negative electrode during charging to derive a more reliable value, and a method for evaluating performance of an electrode.

Technical Solution

A method for evaluating performance of an electrode according to the present invention for achieving the above-described object comprises providing an electrode assembly for evaluating performance; immersing the electrode assembly for evaluating the performance in an electrolyte and applying constant current; and allowing an applied voltage to gradually increase so as to measure a safety voltage at which lithium dendrite starts to occur, wherein the electrode assembly for evaluating the performance comprises a portion at which a negative electrode, a second negative electrode, a separator, a reference electrode, a separator, and a positive electrode are sequentially stacked, and wherein a potential difference value measured between the positive electrode and the second negative electrode is measured as the safety voltage in the reference electrode disposed between the positive electrode and the negative electrode.

In the negative electrode that is in contact with the second negative electrode, a negative electrode active material may be applied to each of both surfaces of a negative electrode collector, and the second negative electrode may be stacked between the negative electrode active material of the negative electrode and the separator.

In addition, the present invention additionally provides an electrode assembly for evaluating performance of an electrode. An electrode assembly for evaluating performance of an electrode according to the present invention comprises: a negative electrode on which a negative electrode active material is applied to both surfaces of a negative electrode collector; a positive electrode on which a positive electrode active material is applied to both surfaces of a positive electrode collector and which is stacked with the negative electrode; two separators stacked between the negative electrode and the positive electrode; a reference electrode stacked between the two separators; and a second negative electrode stacked between a separator of the two separators that is closer to the negative electrode and the negative electrode.

The reference electrode may measure a potential difference occurring when a first current is applied to the positive electrode and the negative electrode and measure a potential difference occurring when a second current is applied to the positive electrode and the second negative electrode.

The second negative electrode may have a hole so that lithium movement is allowable. The second negative electrode may have a mesh structure in which a plurality of holes are continuously repeated, and the second negative electrode may be made of a copper foil.

The second negative electrode may have an area equal to or less than an area of the negative electrode, and the reference electrode may have an area equal to or less than that of the positive electrode.

In addition, in the present invention, the second negative electrode may have an area less than an area of the negative electrode to cover only a portion of the negative electrode active material, and a remaining portion of the second negative electrode may be disposed out of the negative electrode active material. The second negative electrode may be a plurality of second negative electrodes, and the plurality of second negative electrodes are spaced apart from each other between the negative electrode active material and the separator, and the second negative electrode may be made of a same material as the negative electrode collector.

Advantageous Effects

In the present invention having the configuration as described above, since the surface potential value of the negative electrode that is a portion at which the lithium dendrite actually occurs is reflected to the measured value of the safety voltage at which the lithium dendrite starts to occur, the more accurate final safety voltage may be calculated.

That is, when the electrode assembly is charged, the lithium may be inserted from the surface of the negative electrode, and thus, the potential difference between the surface of the negative electrode (the outer surface of the negative electrode active material) and the surface on which the negative electrode collector is in contact with the negative electrode active material may increase as the current increases, and the temperature decreases. However, in order to prevent the lithium dendrite from occurring during the rapid charging, it may be required to measure the potential on the surface of the negative electrode so as to calculate the final safety voltage. Therefore, in the present invention, since the safety voltage is measured based on the surface potential of the negative electrode, the more reliable safety voltage value may be calculated.

MODE FOR CARRYING OUT THE INVENTION

Hereinafter, preferred embodiments of the present invention will be described in detail with reference to the accompanying drawings in such a manner that the technical idea of the present invention may easily be carried out by a person with ordinary skill in the art to which the invention pertains. The present invention may, however, be embodied in different forms and should not be construed as limited to the embodiments set forth herein.

In order to clearly describe the present invention, parts irrelevant to the description are omitted, and the same reference numerals are assigned to the same or similar components throughout the specification.

Also, terms or words used in this specification and claims should not be restrictively interpreted as ordinary meanings or dictionary-based meanings, but should be interpreted as meanings and concepts conforming to the scope of the present invention on the basis of the principle that an inventor can properly define the concept of a term to describe and explain his or her invention in the best ways.

The present invention is invented for the purpose of accurately measuring a safety voltage at which lithium dendrite starts to occur when quick charging is performed. The present invention provides an electrode, which is assembly for evaluating performance of an electrode, which is capable of not only separating and observing a negative electrode potential and a positive electrode potential, but also measuring a safety voltage based on a surface potential of a negative electrode during the charging, and a method for evaluating performance of an electrode.

Figure 1:
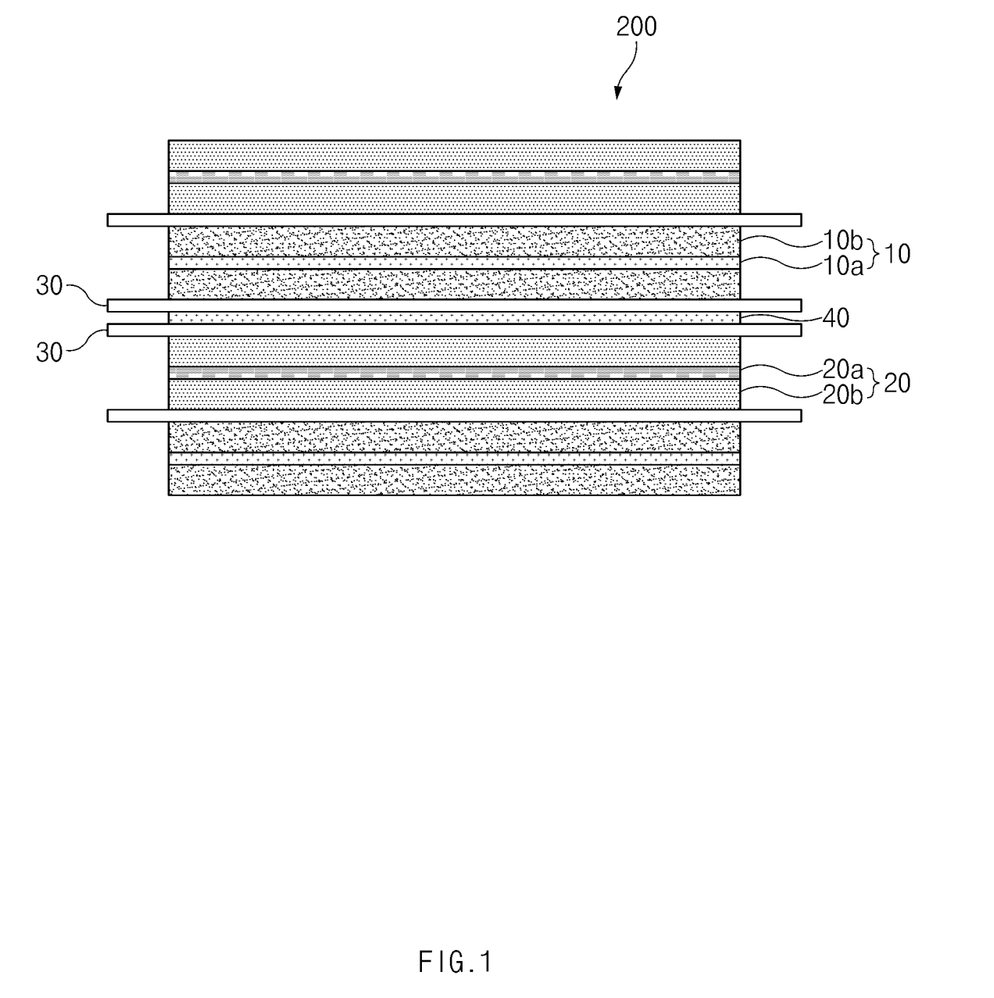
FIG. 1 is a side view of an electrode assembly for evaluating performance of an electrode, which has a structure stacked in order of a positive electrode/separator/negative electrode/separator/reference electrode/separator/positive electrode/separator/negative electrode from below.

FIG. 1 is a side view of an electrode assembly for evaluating performance of an electrode, which has a structure stacked in order of a positive electrode 10/separator 30/negative electrode 20/separator 30/reference electrode 40/separator 30/positive electrode 10/separator 30/negative electrode 20 from below. In a general structure (a structure in which a positive electrode/separator/negative electrode/separator are sequentially repeated) of the electrode assembly, when current flows between the positive electrode and the negative electrode, it is impossible to individually measure a potential of the positive electrode and a potential of the negative electrode. However, as illustrated in FIG. 1, in a structure of an electrode assembly 200 for evaluating performance of an electrode, a potential of the positive electrode and a potential of the negative electrode may be individually measured.

That is, the current may flow between the reference electrode 40 and the positive electrode 10 to measure the positive electrode potential, and the current may flow between the reference electrode and the negative electrode 20 regardless of the positive electrode potential to measure a negative electrode potential.

However, in lithium dendrite during high-current charging, a measured value of the surface potential of the negative electrode 20 becomes a more important variable than the measured value of the total potential of the negative electrode 20.

That is, the positive electrode 10 has a structure in which a positive electrode active material 10b is applied to both surfaces of a positive electrode collector 10a, and the negative electrode 10 has a structure in which a negative electrode active material 20b is applied to both surfaces of a negative electrode collector 20a.

Also, when the charging is performed at low current, lithium ions emitted from the positive electrode active material 10b are gradually permeated from a surface of the negative electrode active material 20b toward the negative electrode collector 20a, and thus, a difference in potential between the negative electrode active material 20b and the negative electrode collector 20a does not occur. However, when the charging is performed at high current, a large amount of emitted lithium ions are concentrated into the surface of the negative electrode active material 20b. Here, when the number of lithium ions concentrated onto the surface of the negative electrode active material 20b is greater than the number of lithium ions permeated toward the negative electrode collector 20a, the lithium dendrite occurs.

Furthermore, a difference in potential between the negative electrode collector 20a and the surface of the negative electrode active material 20b occurs due to a difference between the number of lithium ions in vicinity of the negative electrode collector 20a and the number of lithium ions in the surface of the negative electrode active material 20b.

Thus, a stable voltage at which the lithium dendrite starts to occur should be measured based on the voltage value measured based on the surface of the negative electrode active material 20b, not the voltage measured based on the negative electrode collector 20a.

However, in the structure illustrated in FIG. 1, in the structure provided with only the reference electrode 40, the surface potential of the negative electrode 20 (i.e., the voltage measured based on the surface of the negative electrode active material) may not be measured.

Therefore, the present invention provides a method for evaluating performance of an electrode, which is capable of accurately measuring a safety voltage, at which lithium dendrite starts to occur, as a first embodiment.

First Embodiment

Figure 2:
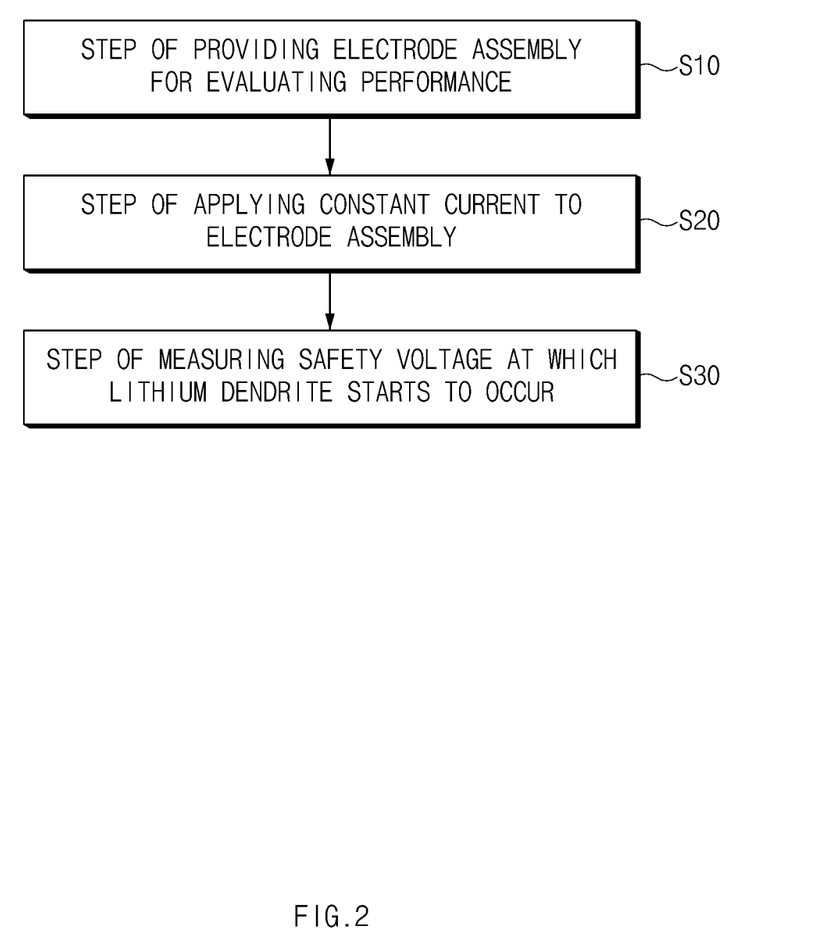
FIG. 2 is a flowchart illustrating each of steps in a method for evaluating performance of an electrode according to the present invention.

Referring to FIG. 2 that is a flowchart illustrating steps of a method for evaluating performance an electrode according to the present invention, the evaluation method according to the present invention comprises a step (S10) of providing an electrode assembly for evaluating performance, a step (S20) of immersing the electrode assembly 100 for evaluating the performance in an electrolyte (not shown) and applying constant current, and a step (S30) of allowing an applied voltage to gradually increase so as to measure a safety voltage at which lithium dendrite starts to occur.

The electrode assembly for evaluating the performance, which is provided in the step (S10) of providing the electrode assembly for evaluating the performance essentially comprises a portion at which a positive electrode 10/separator 30/negative electrode 20 are repeatedly stacked, i.e., a portion at which at least a negative electrode 20, a second negative electrode 50, a separator 30, a reference electrode 40, a separator 30, and a positive electrode 10 are sequentially stacked.

Also, the electrode assembly 100 for evaluating the performance is immersed in the electrolyte so that lithium ions are movable to allow the current to flow, and constant current is applied.

Here, a step (S30) of measuring the safety voltage by using a voltage measured in the reference electrode 40 is performed. The safety voltage is measured as a potential between the reference electrode 40 and the second negative electrode 50 and a potential between the reference electrode 40 and the positive electrode 10 when the lithium dendrite occurs.

That is, the current is applied between the reference electrode 40 and the second negative electrode 20 to measure a difference in potential, and separately, the current is applied between the reference electrode 40 and the positive electrode 10 to measure a difference in potential. Also, a difference in potential between the positive electrode 10 and the second negative electrode 50 may be obtained through a difference between the two values.

That is, the potential difference between the positive electrode 10 and the second negative electrode 50 corresponds to a potential difference value between the positive electrode collector and the surface of the negative electrode active material. More accurate and reliable stable voltage may be obtained through the potential difference value.

In the first embodiment, the second negative electrode 50 may have a size corresponding to a size of the negative electrode 20.

Figure 4A:
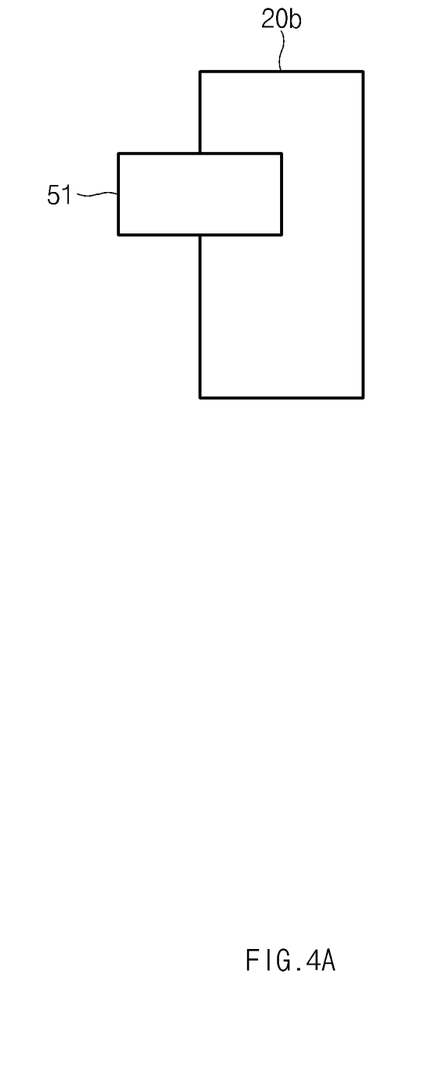
FIG. 4a is a plan view illustrating a state in which a second negative electrode is stacked on a negative electrode active material, wherein the second negative electrode covers only a portion of the negative electrode active material, and a portion of the second negative electrode protrudes out of the negative electrode active material according to a third embodiment of the present invention.
Figure 4B:
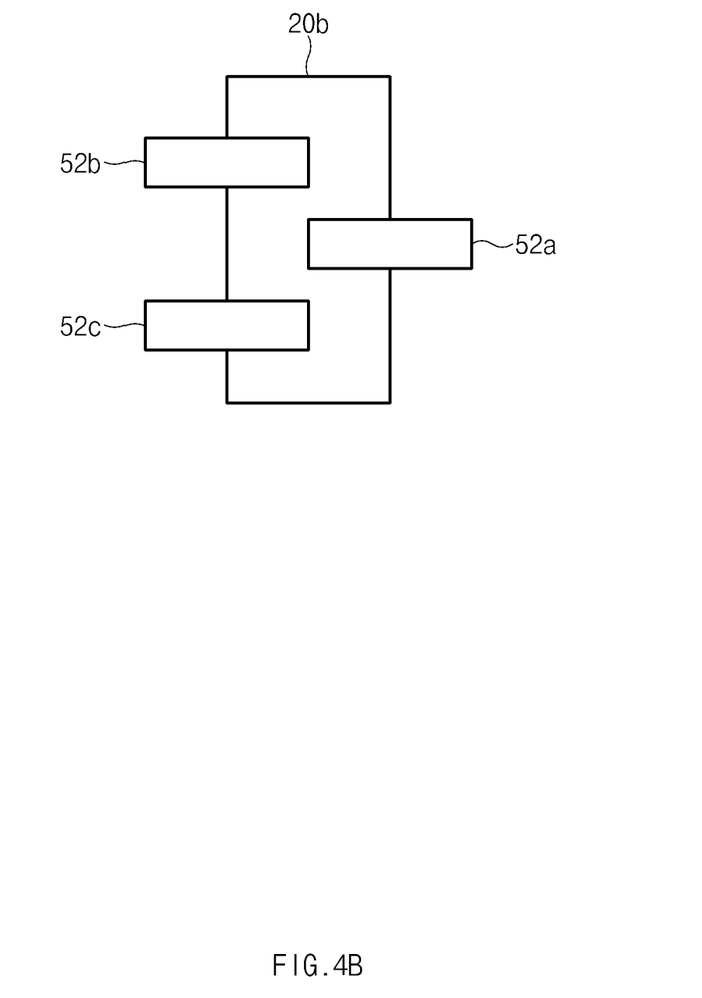
FIG. 4b is a plan view illustrating a state in which a second negative electrode is stacked on a negative electrode active material, wherein the second negative electrode is provided in plurality, and one of the second negative electrode is disposed on a central side of the negative electrode active material, and others are disposed at a relatively outer side according to a fourth embodiment of the present invention.

However, as illustrated in FIG. 4b, a plurality of second negative electrodes 50 may be separately spaced apart from each other between the separator 30 and the negative electrode active material 20b. Here, potentials of the second negative electrode near the center and the second negative electrode near the outer side among the second negative electrodes 50 may be measured to determine whether lithium ions are instantaneously concentrated in a specific portion of the surface of the negative electrode active material 20b (for example, a potential difference is highly measured at a portion into which the lithium ions are concentrated).

Second Embodiment

Furthermore, the present invention provides an electrode assembly 100 for evaluating performance, which is used for the above-described method for evaluating the performance of the electrode as a second embodiment.

Figure 3:
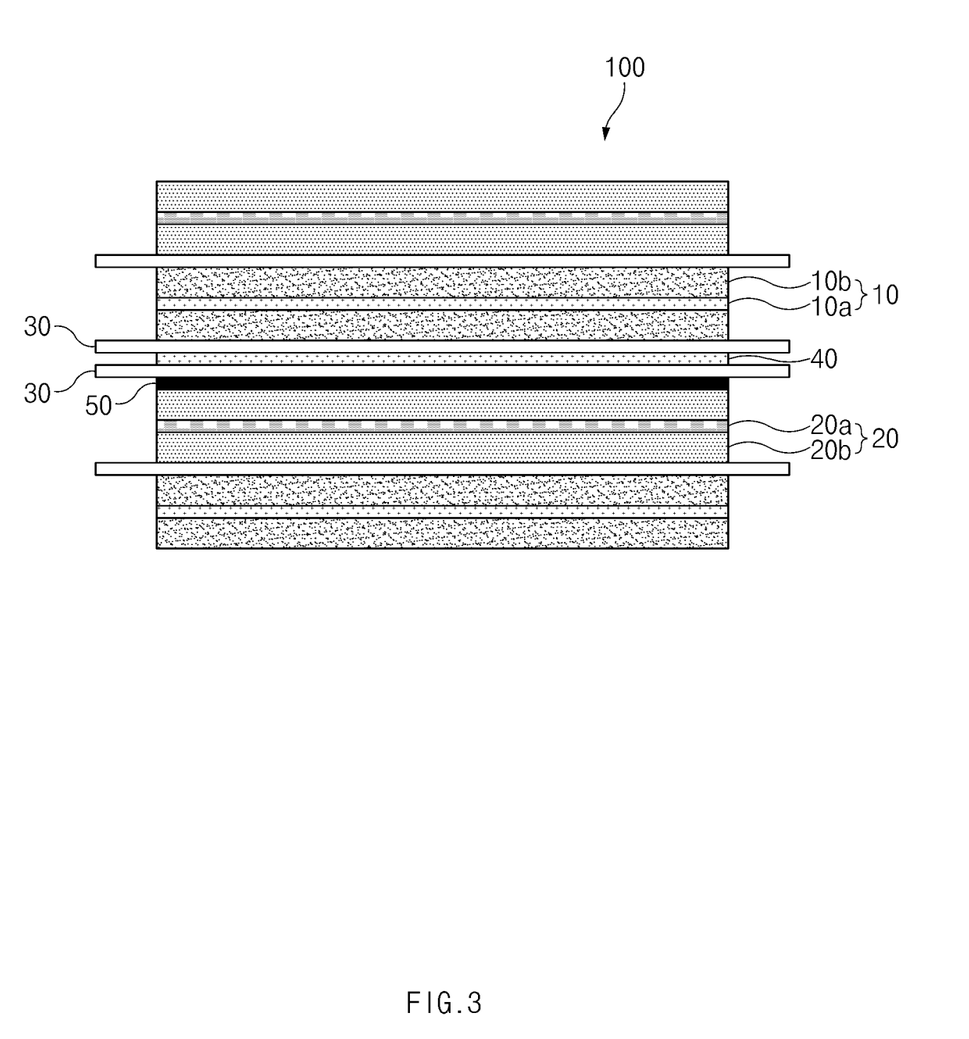
FIG. 3 is a side view of an electrode assembly for evaluating performance of an electrode, which has a structure stacked in order of a positive electrode/separator/negative electrode/second negative electrode/separator/reference electrode/separator/positive electrode/separator/negative electrode from below according to the present invention.

FIG. 3 is a side view of an electrode assembly for evaluating performance of an electrode, which has a structure stacked in order of a positive electrode 10/separator 30/negative electrode 20/second negative electrode 50/separator 30/reference electrode 40/separator 30/positive electrode 10/separator 30/negative electrode 20 from below according to the present invention.

The electrode assembly 100 for evaluating the performance according to this embodiment has a structure in which the electrodes and the separators are stacked in order illustrated in FIG. 3. That is, the negative electrode 20 is coated with a negative electrode active material 20b on both surfaces of a negative electrode collector 20a, the positive electrode 10 is coated with a positive electrode active material 10b on both surfaces of a positive electrode collector 10a, and two separators 30 are stacked between the negative electrode 20 and the positive electrode 10.

Also, a reference electrode 40 is stacked between the two separators 30, and the second negative electrode 50 is stacked between the separator (the lower separator of the two separator in FIG. 3), which is relatively close to the negative electrode 20 among the separators 40, and the negative electrode 20.

In the electrode assembly 100 for evaluating the performance according to this embodiment essentially comprises a configuration in which the positive electrode 10, the negative electrode 20, and the separator 30 are repeatedly stacked above the uppermost negative electrode 20 and below the lowermost positive electrode 10, i.e., essentially comprises at least the above-described configuration in which the reference electrode 40 and the second negative electrode 50 are stacked.

In the electrode assembly 100 for evaluating the performance having the configuration, the current is applied in the state in which the electrolyte is immersed so that lithium ions flows between the positive electrode 10 and the negative electrode 20.

Also, when the current is applied, a potential generated between the positive electrode 10 and the second negative electrode 50 may be measured through the reference electrode 40.

That is, the potential difference occurring between the second negative electrode 50 and the positive electrode 10 may be measured by measuring the potential between the reference electrode 40 and the positive electrode 10 and the potential between the reference electrode 40 and the second negative electrode 50. Since the potential difference varies according to an amount of applied current, the potential difference at which the lithium dendrite starts to occur may be calculated.

In this embodiment, the second negative electrode 50 has a structure in which a hole is punched to allow lithium to move. For example, both sides may have a plurality of punched holes. More preferably, the second negative electrode 50 may have a mesh structure in which a plurality of holes are continuously repeated.

Furthermore, the second negative electrode 50 is made of a copper material (more specifically, foil made of copper) and has an area equal to or less than that of the negative electrode 20. On the other hand, the reference electrode 40 may have an area equal to or less than that of the positive electrode.

Third Embodiment

FIG. 4a is a plan view illustrating a state in which a second negative electrode is stacked on a negative electrode active material, wherein the second negative electrode covers only a portion of the negative electrode active material, and a portion of the second negative electrode protrudes out of the negative electrode active material according to a third embodiment of the present invention.

A second negative electrode 51 according to this embodiment may have a structure in which a portion thereof is disposed between a separator 30 and a negative electrode active material 20b so that a wire of a measuring device is easily connected when measuring a potential, and a remaining portion thereof is disposed out of the negative electrode active material 20b. Here, an area of the second negative electrode 51, which covers the negative electrode active material 20b, may be determined at a level that does not interfere with permeation of lithium ions and does not generate unnecessary resistance.

Fourth Embodiment

FIG. 4b is a plan view illustrating a state in which a second negative electrode is stacked on a negative electrode active material, wherein the second negative electrode is provided in plurality, and one of the second negative electrode is disposed on a central side of the negative electrode active material, and others are disposed at a relatively outer side according to a fourth embodiment of the present invention.

In this embodiment, a plurality of second negative electrodes 52 (52a, 52b, and 52c) may be disposed. Thus, an entire area of a negative electrode active material may be divided to instantaneously measure potentials at some points or several points.

Fifth Embodiment

Figure 4C:
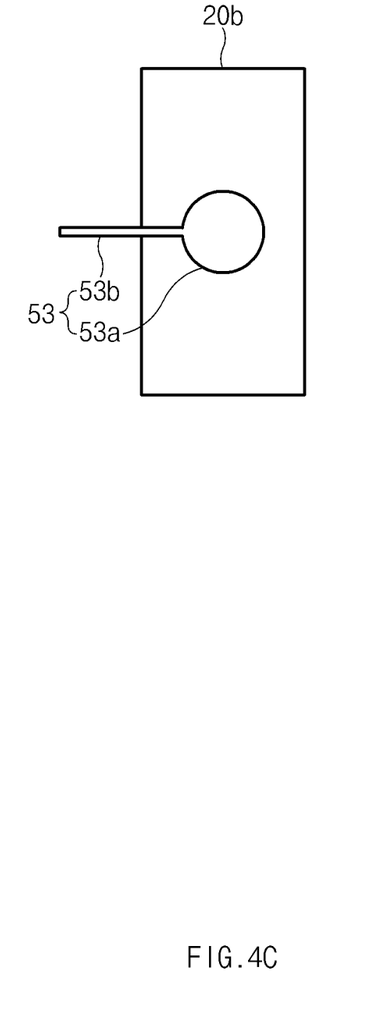
FIG. 4c is a plan view illustrating a state in which a second negative electrode is stacked on a negative electrode active material, wherein the second negative electrode is disposed at a central side of the negative electrode active material and protrudes from the negative electrode active material to extend in a line shape having a relatively thin width according to a fifth embodiment of the present invention.

FIG. 4c is a plan view illustrating a state in which a second negative electrode is stacked on a negative electrode active material, wherein the second negative electrode is disposed at a central side of the negative electrode active material and protrudes from the negative electrode active material to extend in a line shape having a relatively thin width according to a fifth embodiment of the present invention.

In this embodiment, the second negative electrode 53 may have a circular shape and a polygonal shape, and a portion 53b having a width that is narrower than that of a portion 53a at which an actual potential is measured may be drawn out of the negative electrode active material 20b.

The second negative electrodes 51, 52, and 53 provided in third to fifth embodiments do not cover the entire negative electrode active material 20b. Therefore, since lithium ions pass between the negative electrode active material 20b and the separator 30 through the portion that is not covered by the second negative electrodes 51, 52, 53, each of the second negative electrodes 51, 52, and 53 provided in the third to fifth embodiments may have a non-porous structure. That is, since each of the second negative electrodes 51, 52, and 53 has the non-porous structure, each electrode may be prevented from being ruptured and have a thin thickness.

That is, in the second embodiment, the second negative electrode 50 may be disposed between the negative electrode 20 and the separator 30 and have the porous structure so that the lithium ions passing through the separator 30 are capable of being permeated into the negative electrode active material 20b. In the third to fifth embodiments, the negative electrodes 51, 52, and 53 may partially cover the negative electrode active material 20b, and the lithium ions may pass through the remaining portions. However, an area, a thickness, a shape, etc. of the second negative electrode, which defines a structure that allows the lithium ions to normally pass therethrough, are not limited.

As described above, since each of the second negative electrodes 51, 52, and 53 is made of the same copper foil material as the negative electrode collector 20a, the negative electrode collector 20a may be processed after applying the negative electrode active material 20b to the negative electrode collector 20a, and the remaining surplus copper foil may be used to be processed as the second negative electrodes 51, 52, and 53.

In the present invention having the above-described configuration, since the measured value of the safety voltage at which the lithium dendrite starts to occur is measured based on the surface potential of the negative electrode active material, which is a portion at which the lithium dendrite occurs actually, the more reliable safety voltage may be measured.

That is, when the electrode assembly is charged, the lithium may be inserted from the surface of the negative electrode, and thus, the potential difference between the surface of the negative electrode 20 (the outer surface of the negative electrode active material and the surface on which the negative electrode collector 20a is in contact with the negative electrode active material 20b may increase as the current increases, and the temperature decreases.

However, in order to prevent the lithium dendrite from occurring during the rapid charging, it may be essentially required to measure the potential on the surface of the negative electrode so as to calculate the final safety voltage. Therefore, in the present invention, since the safety voltage is measured based on the surface potential of the second negative electrode 50, the reliability may be improved.

While the embodiments of the present invention have been described with reference to the specific embodiments, it will be apparent to those skilled in the art that various changes and modifications may be made without departing from the spirit and scope of the invention as defined in the following claims.

DESCRIPTION OF THE SYMBOLS

10: Positive electrode
20: Negative electrode
30: Separator
40: First reference electrode
50: Second reference electrode

The invention claimed is:

1. A method for evaluating performance of an electrode, the method comprising:
providing an electrode assembly for evaluating performance;
immersing the electrode assembly for evaluating the performance in an electrolyte and applying constant current; and
allowing an applied voltage to gradually only increase so as to measure a safety voltage at which lithium dendrite starts to occur,
wherein the electrode assembly for evaluating the performance comprises a portion at which a negative electrode, a second negative electrode, a separator, a reference electrode, a separator, and a positive electrode are sequentially stacked, and
wherein a potential difference value measured between the positive electrode and the second negative electrode is measured as the safety voltage in the reference electrode disposed between the positive electrode and the second negative electrode.

2. The method of claim 1, wherein, in the negative electrode that is in contact with the second negative electrode, a negative electrode active material is applied to each of both surfaces of a negative electrode collector, and the second negative electrode is stacked between the negative electrode active material of the negative electrode and the separator.

3. An electrode assembly for evaluating performance of an electrode, the electrode assembly comprising:
a negative electrode on which a negative electrode active material is applied to both surfaces of a negative electrode collector;
a positive electrode on which a positive electrode active material is applied to both surfaces of a positive electrode collector and which is stacked with the negative electrode;
two separators stacked between the negative electrode and the positive electrode;
a reference electrode stacked between the two separators; and
a second negative electrode stacked between a separator of the two separators that is closer to the negative electrode and the negative electrode and directly contacting the negative electrode.

4. The electrode assembly of claim 3, wherein the reference electrode measures a potential difference occurring when a first current is applied to the positive electrode and the negative electrode and measure a potential difference occurring when a second current is applied to the positive electrode and the second negative electrode.

5. The electrode assembly of claim 4, wherein the second negative electrode has a hole so that lithium movement is allowable.

6. The electrode assembly of claim 5, wherein the second negative electrode has a mesh structure in which a plurality of holes are continuously repeated.

7. The electrode assembly of claim 6, wherein the second negative electrode is made of a copper foil.

8. The electrode assembly of claim 6, wherein the second negative electrode has an area equal to or less than an area of the negative electrode.

9. The electrode assembly of claim 4, wherein the reference electrode has an area equal to or less than an area of the positive electrode.

10. The electrode assembly of claim 4, wherein the second negative electrode has an area less than an area of the negative electrode to cover only a portion of the negative electrode active material, and a remaining portion of the second negative electrode is disposed out of the negative electrode active material.

11. The electrode assembly of claim 10, wherein the second negative electrode is a plurality of second negative electrodes, and the plurality of second negative electrodes are spaced apart from each other between the negative electrode active material and the separator.

12. The electrode assembly of claim 10, wherein the second negative electrode is made of a same material as the negative electrode collector.

* * * * *